(12) United States Patent
Wadhwa

(10) Patent No.: US 7,635,994 B1
(45) Date of Patent: Dec. 22, 2009

(54) FAST RAIL-TO-RAIL VOLTAGE COMPARATOR AND METHOD FOR RAIL-TO-RAIL VOLTAGE COMPARISON

(75) Inventor: Sameer Wadhwa, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/336,464

(22) Filed: Jan. 20, 2006

(51) Int. Cl.
*H03K 5/22* (2006.01)
(52) U.S. Cl. .............................. 327/63; 327/65; 327/66
(58) Field of Classification Search ........................ None
See application file for complete search history.

(56) References Cited

U.S. PATENT DOCUMENTS

| | | | |
|---|---|---|---|
| 6,429,735 B1 * | 8/2002 | Kuo et al. .................... | 327/563 |
| 6,731,139 B1 * | 5/2004 | Wert et al. ..................... | 327/49 |
| 7,323,936 B2 * | 1/2008 | Dickman et al. ............. | 330/261 |
| 2001/0004219 A1 * | 6/2001 | Bangs et al. ................... | 327/65 |

OTHER PUBLICATIONS

Rivoir et al.; "A 1 mV Resolution, 10 MS/s Rail-to-Rail Comparator in 0.5μm Low-Voltage CMOS Digital Process", IEEE International Symposium on Circuits and Systems, Jun. 1997.

* cited by examiner

*Primary Examiner*—Tuan Lam
*Assistant Examiner*—Hiep Nguyen

(57) ABSTRACT

Method and apparatus are provided for fast rail-to-rail voltage comparison. A rail-to-rail voltage comparator for indicating one of two states with an output signal in response to an input signal is provided comprising an input stage having an input configured to receive the input signal and having an output, and an amplification circuit having an input coupled to the output of the input stage. The input stage comprises a first differential amplifier having a first input-voltage range and configured to produce a first current based on the input signal, a second differential amplifier having a second input-voltage range and configured to produce a second current based on the input signal, and a summing circuit having a first input coupled to the first differential amplifier and having a second input coupled to the second differential amplifier. The first input-voltage range overlaps the second input-voltage range. The summing circuit is configured to produce a first voltage at the output of the input stage based on a sum of the first current and the second current. The amplification circuit is configured to incrementally amplify the first voltage to a second voltage and further configured to produce the output signal having the second voltage. The second voltage indicates one of the two states.

13 Claims, 3 Drawing Sheets

FAST RAIL-TO-RAIL VOLTAGE COMPARATOR AND METHOD FOR RAIL-TO-RAIL VOLTAGE COMPARISON

FIELD OF THE INVENTION

The present invention generally relates to electronic circuits, and more particularly relates to voltage comparator circuits.

BACKGROUND OF THE INVENTION

Voltage comparator circuits are used in a number of applications to compare an input voltage with a reference voltage and indicate whether the input voltage is greater or less than the reference voltage. In one example, voltage comparator circuits have been used with memory read or retrieval devices to detect the data stored in a data storage device, such as a flash memory device. A flash memory device may have a large number of storage elements for storing data (e.g., one bit or two bits per storage element). During the process of reading the flash memory device, a read device may apply a pre-determined voltage across the terminals of a storage element to determine the status of the storage element, such as the presence of data in the storage element or an indication of an erased storage element or programmed storage element.

If the storage element has been erased, the storage element may draw a substantial amount of current (e.g., 40 µA) in response to the voltage application. If the storage element has been programmed, the storage element may draw significantly less current (e.g., 3 µA) in response to this voltage application. Using a voltage comparator having a reference current (e.g., 20 µA) between these two currents and current-to-voltage converters, the voltage comparator may determine whether the current drawn by the storage element is greater than or less than the reference current and thus determine the status of each storage element (e.g., erased or programmed) in the flash memory device.

In some conventional voltage comparators, the rate of comparing an input voltage with a reference potential may be compromised by the number of dominant poles, within the voltage comparator, having an associated load impedance (e.g., input impedance from transistors at a particular circuit node in the voltage comparator). For example, some conventional voltage comparators with a greater number of dominant poles may have a slower comparison rate. Memory read or retrieval devices incorporating these voltage comparators generally have slower read rates. While limiting the number of these dominant poles may tend to increase the comparison rate, the range of input voltage may be sacrificed (e.g., a smaller input voltage range) and decrease the sensitivity of the voltage comparator.

Accordingly, a voltage comparator circuit is desired having a relatively fast voltage comparison. In addition, a voltage comparator circuit is desired for rail-to-rail input voltage comparison. In addition, a method for voltage comparison is desired having a relatively fast comparison of an input voltage while increasing sensitivity. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods and apparatus are provided for fast rail-to-rail voltage comparison. In an exemplary embodiment, a rail-to-rail voltage comparator is provided for indicating one of two states with an output signal in response to an input signal. The rail-to-rail voltage comparator comprises an input stage having an input configured to receive the input signal and having an output, an amplification circuit having an input coupled to the output of the input stage and configured to produce the output signal of the rail-to-rail comparator, and a data latch coupled to the amplification circuit and configured to store the output signal of the rail-to-rail comparator. The input stage comprises a first differential amplifier having a first input-voltage detection range and configured to produce a first current based on the input signal, a second differential amplifier having a second input-voltage detection range and configured to produce a second current based on the input signal, and a current mirror circuit having a first input coupled to the first differential amplifier and having a second input coupled to the second differential amplifier. The first input-voltage detection range overlaps the second input-voltage detection range. The current mirror circuit is configured to produce a first voltage at the output of the input stage in response to a sum of the first current and the second current. The amplification circuit is configured to incrementally amplify the first voltage to a second voltage and further configured to produce the output signal of the rail-to-rail voltage comparator having the second voltage, where the second voltage indicates one of the two states.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description.

In another exemplary embodiment, a voltage comparator is provided for converting a first signal to a second signal indicating one of two states. The voltage comparator comprises a first voltage detector having first and second differential inputs configured to receive the first signal and having a current input, a second voltage detector having first and second differential inputs configured to receive the first signal and having a current output, a current mirror circuit having a first input coupled to the current input of the first voltage detector and having a second input coupled to the current output of the second voltage detector, a first amplification stage coupled to an output of the current mirror circuit and configured to amplify the first voltage to an intermediate voltage, a second amplification stage coupled to the first amplification stage and configured to amplify the intermediate voltage to a second voltage, thereby producing the second signal having the second voltage, and a data latch coupled to the second amplification stage and configured to store the second signal. The first voltage detector is configured to produce a first current based on the first signal. The second voltage detector is configured to produce a second current based on the first signal. The current mirror circuit is configured to produce a first voltage in response to a sum of the first current and the second current.

In another exemplary embodiment, a method is provided for indicating one of two states from an input voltage. The method comprises the steps of producing a first current with an N-type differential amplifier having a first voltage detection range in response to the input voltage, producing a second current with a P-type differential amplifier having a second voltage detection range in response to the input voltage, summing the first current with the second current to produce a third current, and converting the third current to a voltage, the voltage indicating one of the two states. The first voltage detection range overlaps the second voltage detection range.

Figure 1:
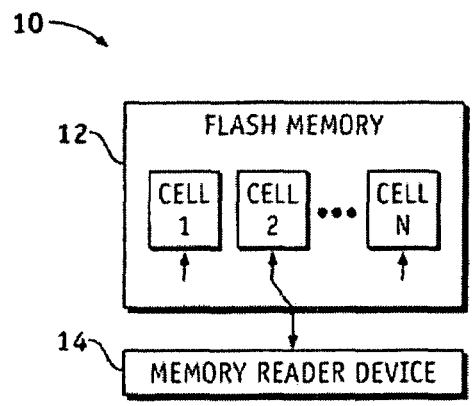
FIG. 1 is a block diagram of a flash memory storage and read system in accordance with an exemplary embodiment of the present invention.

Referring to the drawings, FIG. 1 is a block diagram of a flash memory storage and read system 10 in accordance with an exemplary embodiment of the present invention. The system 10 comprises a flash memory 12 and a memory reader device 14 configured to couple with the flash memory such as via an input slot. The flash memory 12 has any number of storage elements or cells (e.g., CELL1, CELL2, ..., CELLN) depending on the memory size of the flash memory 12 and provides writable/erasable memory to store data for a variety of applications. The memory reader device 14 may be an independent unit or incorporated as a component into another electronic device including, by way of example and not of limitation, a digital camera, an MP3 player, a computer, and the like. When the flash memory 12 is coupled to the memory reader device 14, the memory reader device 14 determines a status or state of the cells in the flash memory 12, such as by probing one or more cells. To determine the status of a cell, the memory reader device 14 applies a voltage to the cell, detects a current drawn by the cell in response to the applied voltage, converts this current to a voltage, and compares this voltage with a reference. When the voltage is greater than the reference, the cell has an erased status (e.g., contains no data), and when the voltage is less than the reference, the cell has a programmed status (e.g., contains data). Based on the status of the cell, data may be retrieved from or stored into the particular cell in the flash memory.

Figure 2:
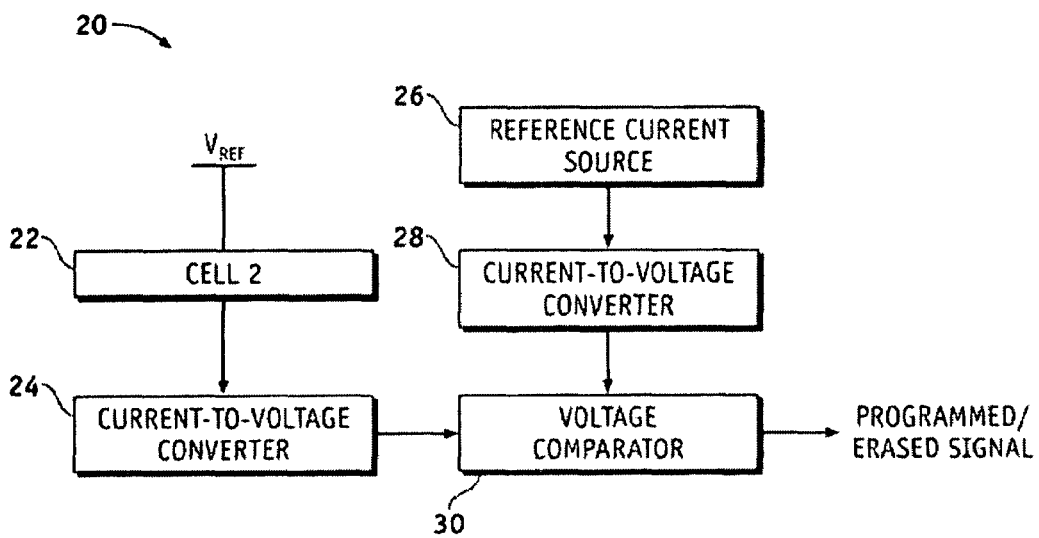
FIG. 2 is a block diagram of a portion of a memory cell reading circuit in accordance with an exemplary embodiment of the present invention.

FIG. 2 is a block diagram of a portion of a memory cell reading circuit 20 in accordance with an exemplary embodiment of the present invention. The memory cell reading circuit 20 comprises a storage element 22 (e.g., CELL2) having an input configured to receive a reference potential (e.g., $V_{REF}$) and having an output, a first current-to-voltage converter 24 having an input coupled to the output of the storage element 22, a voltage comparator 30 having a first input coupled to an output of the first current-to-voltage converter 24, a reference current source 26, a second current-to-voltage converter 28 having an input coupled to the reference current source 26 and having an output coupled to a second input of the voltage comparator 30. Based on the current drawn by the storage element 22 and a reference current (e.g., provided by the reference current source 26), the memory cell reading circuit 20 determines whether the storage element has been programmed or erased and produces an output signal indicating a programmed status or erased status, respectively. Although the memory cell reading circuit 20 has separate current-to-voltage converters 24, 28, a single current-to-voltage converter may be used having a first input configured to receive the current drawn by the storage element 22 and a second input configured to receive the reference current.

In operation, the storage element 22 draws a current when the reference potential is applied to the terminals of the storage element 22, and the first current-to-voltage converter 24 produces an input signal having a voltage based on the current drawn by the storage element 22. The reference current source 26 provides a reference current that, when converted to a corresponding reference voltage, is preferably within a rail-to-rail voltage range of the memory cell reading circuit 20. This rail-to-rail voltage range is preferably selected to include a first voltage value corresponding to a pre-determined maximum current drawn by the storage element 22 and a second voltage value corresponding to a pre-determined minimum current drawn by the storage element 22. The second current-to-voltage converter 28 produces a reference voltage based on the reference current, and the voltage comparator 30 compares the voltage of the input signal from the first current-to-voltage converter 24 to the reference voltage to determine whether the input voltage is greater or less than the reference voltage, thereby indicating the status of the storage element 22.

Figure 3:
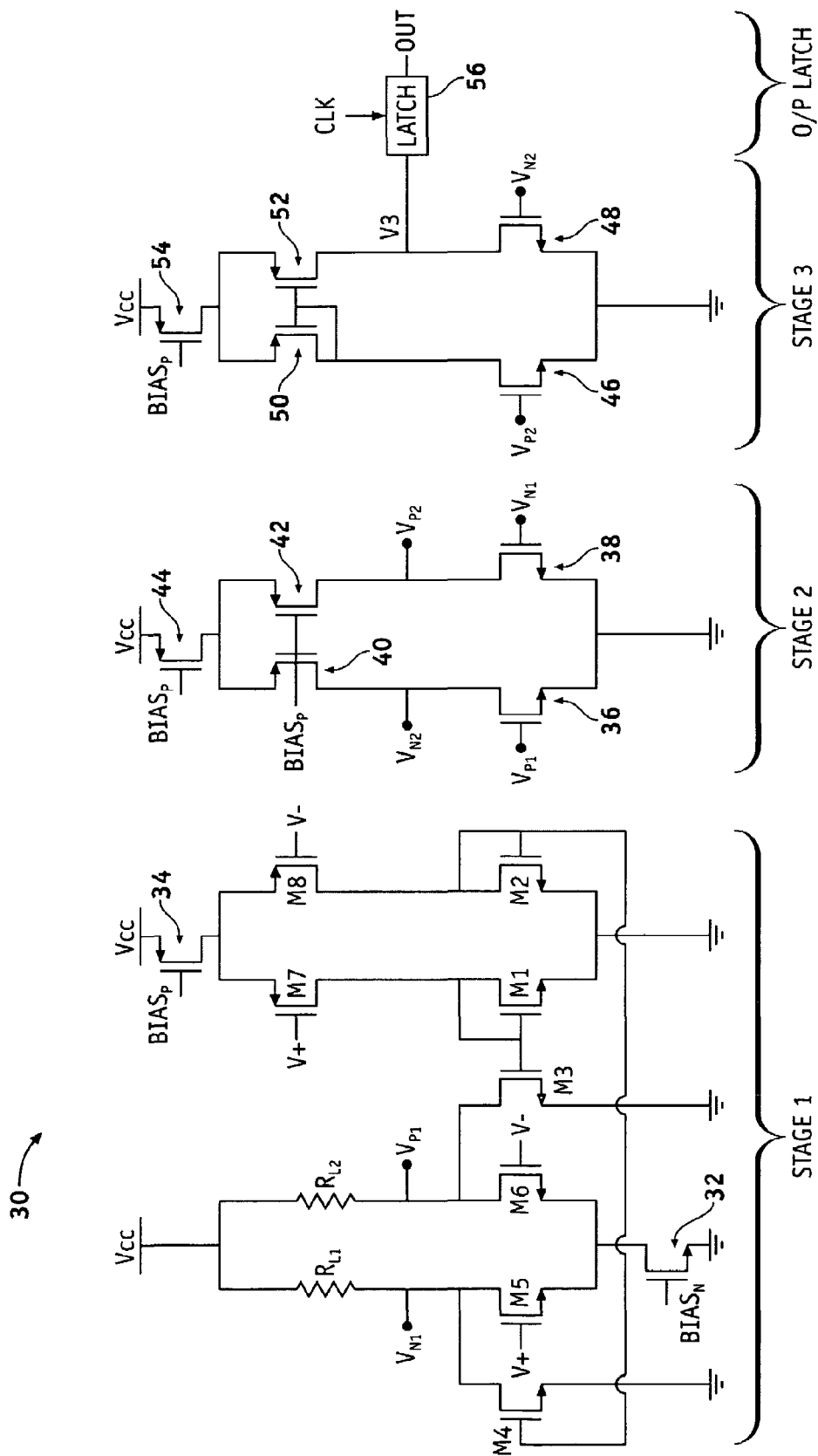
FIG. 3 is a schematic diagram of the voltage comparator shown in FIG. 2 in accordance with an exemplary embodiment of the present invention.

FIG. 3 is a schematic diagram of the voltage comparator 30 shown in FIG. 2 in accordance with an exemplary embodiment of the present invention. The voltage comparator 30 comprises first, second, and third stages (Stage 1, Stage 2, Stage 3) and an output latch 56 having a first input coupled to the third stage (Stage 3). More particularly, the first stage (Stage 1) is an input stage that has first and second differential inputs configured to receive a differential input signal (e.g., V+, V−), such as received from the current-to-voltage converter 24 shown in FIG. 2, and has first and second differential outputs ($V_{N1}$, $V_{P1}$). The second stage (Stage 2) is a first amplification stage and the third stage (Stage 3) is a second amplification stage which together form an amplification circuit, wherein the second stage (Stage 2) has first and second differential inputs coupled to the differential outputs of the first stage (Stage 1) and has first and second differential outputs ($V_{N2}$, $V_{P2}$), and the third stage (Stage 3) has first and second differential inputs coupled to the differential outputs of the second stage with a single output (e.g., V3) of the third stage (Stage 3) coupled to the output latch 56. The output latch 56 has a second input configured to receive a clock signal (e.g., CLK) and is configured to store the output signal of the voltage comparator 30 and transmit the output signal indicating an erased storage element (e.g., a HI signal having a voltage of $V_{CC}$) or a programmed storage element (e.g., a LOW signal having 0V).

The first stage (Stage 1), or input stage, of the voltage comparator 30 includes an N-type differential input amplifier (M5, M6) having first and second inputs configured to receive the differential input signal (e.g., V+, V−), an N-type bias transistor 32 having a drain coupled to a current output of the N-type differential input amplifier (M5, M6) and having a source configured to receive a first reference potential (e.g., a ground), and a P-type differential input amplifier (M7, M8) having first and second inputs configured to receive the differential input signal (e.g., V+, V−), a P-type bias transistor 34 having a source coupled to a second reference potential (e.g., $V_{CC}$) and having a drain coupled to a current input of the P-type differential input amplifier (M7, M8). The first stage (Stage 1) further includes a current mirror circuit (M1, M2, M3, M4) having a first current input coupled to receive a first current from a current output of the P-type differential input amplifier (M7, M8) at drains of the transistors M1 and M2 of the current mirror circuit and a second current input coupled to receive a second current from the current input of the N-type differential input amplifier (M5, M6) at drains of the transistors M3 and M4 of the current mirror circuit, and a differential resistive load ($R_{L1}$, $R_{L2}$) having a first terminal coupled to the current input of the N-type differential input amplifier (M5, M6) and the second current input of the current mirror circuit (M1, M2, M3, M4) and having a second terminal configured to receive the second reference potential (e.g., $V_{CC}$).

In the first stage (Stage 1), the N-type differential input amplifier (M5, M6) and the current mirror circuit (M1, M2, M3, M4) each have a current output configured to receive the first reference potential (e.g., a ground). The N-type bias transistor 32 is biased by a first bias potential (e.g., $BIAS_N$) and the P-type bias transistor 34 is biased by a second bias potential (e.g., $BIAS_P$). The first stage (Stage 1) determines whether the differential input signal is greater than or less than a reference voltage and outputs a differential output signal having a first voltage. The N-type differential input amplifier (M5, M6) and the P-type differential input amplifier (M7, M8) perform voltage comparison when the voltage of the differential input signal exceeds a threshold voltage (e.g., a gate-source threshold of the transistors M5, M6, M7, M8). Based on this threshold voltage, the N-type differential input amplifier (M5, M6) has a first effective input-voltage detection range as defined by the threshold voltage and the N-type bias transistor 32, and the P-type differential input amplifier (M7, M8) has a second effective input-voltage detection range between as defined by the threshold voltage and the P-type bias transistor 34, wherein the first and second effective input-voltage detection ranges overlap.

The second stage (Stage 2) of the voltage comparator 30, i.e., the first amplification circuit, amplifies the first voltage of the differential output signal from the first stage (Stage 1) to produce a differential output signal having an intermediate voltage. In an exemplary embodiment, the second stage (Stage 2) comprises an N-type differential input amplifier 36, 38 having the first and second differential inputs coupled to the differential outputs ($V_{N1}$, $V_{P1}$) of the first stage (Stage 1), a P-type differential output amplifier 40, 42 having a current output coupled to a current input of the N-type differential input amplifier 36, 38, and a P-type bias transistor 44 having a source coupled to the second reference potential (e.g., $V_{CC}$) and having a drain coupled to a current input of the P-type differential amplifier 40, 42. A current output of the N-type differential amplifier 40, 42 is configured to receive the first reference potential (e.g., a ground), and the gates of the P-type differential amplifier 40, 42 are coupled together. The P-type differential amplifier 40, 42 and the P-type bias transistor 44 are biased by the second bias potential (e.g., $BIAS_P$).

The third stage (Stage 3) of the voltage comparator 30, i.e. the second amplification circuit, amplifies the intermediate voltage of the differential output signal from the second stage (Stage 2) and produces an output signal having a second voltage. In an exemplary embodiment, the third stage (Stage 3) comprises an N-type differential input amplifier 46, 48 having the first and second differential inputs coupled to the differential outputs ($V_{N2}$, $V_{P2}$) of the second stage (Stage 2), a single-ended P-type output amplifier 50, 52 having a current output coupled to a current input of the N-typed differential input amplifier 46, 48, and a P-type bias transistor 54 having a source coupled to the second reference potential (e.g., $V_{CC}$) and having a drain coupled to a current input of the single-ended output amplifier 50, 52. The gates of the P-type output amplifier 50, 52 are coupled together and to the current output of a first transistor 50 of the P-type output amplifier 50, 52. The P-type bias transistor 54 is biased by the second bias potential (e.g., $BIAS_P$).

The gain and speed of each stage in the voltage comparator 30 may be adjusted by adjusting the current drawn through each of the bias transistors 32, 34, 44, 54. In an exemplary embodiment, the currents drawn through each of the bias transistors 32, 34, 44, 54 are adjusted to maintain a relatively fast voltage comparison rate while meeting the gain requirements at the output of the voltage comparator circuit 30. For example, the current drawn through each of the bias transistors 32, 34, 44, 54 are adjusted such that the first stage (Stage 1) has a gain of about 2-3, the second stage (Stage 2) has a gain of about 10-15, and the third stage (Stage 3) has a gain of about 20-25. By cascading the first, second, and third stages (Stage 1, Stage 2, Stage 3) and increasing the gain from the first stage (Stage 1) to the third stage (Stage 3), a relatively fast voltage comparison may be performed in the first stage (Stage 1) while increasing the overall voltage sensitivity of voltage comparator 30. Additionally, a rail-to-rail comparison may be performed while minimizing any compromise to the rate of voltage comparison.

Figure 4:
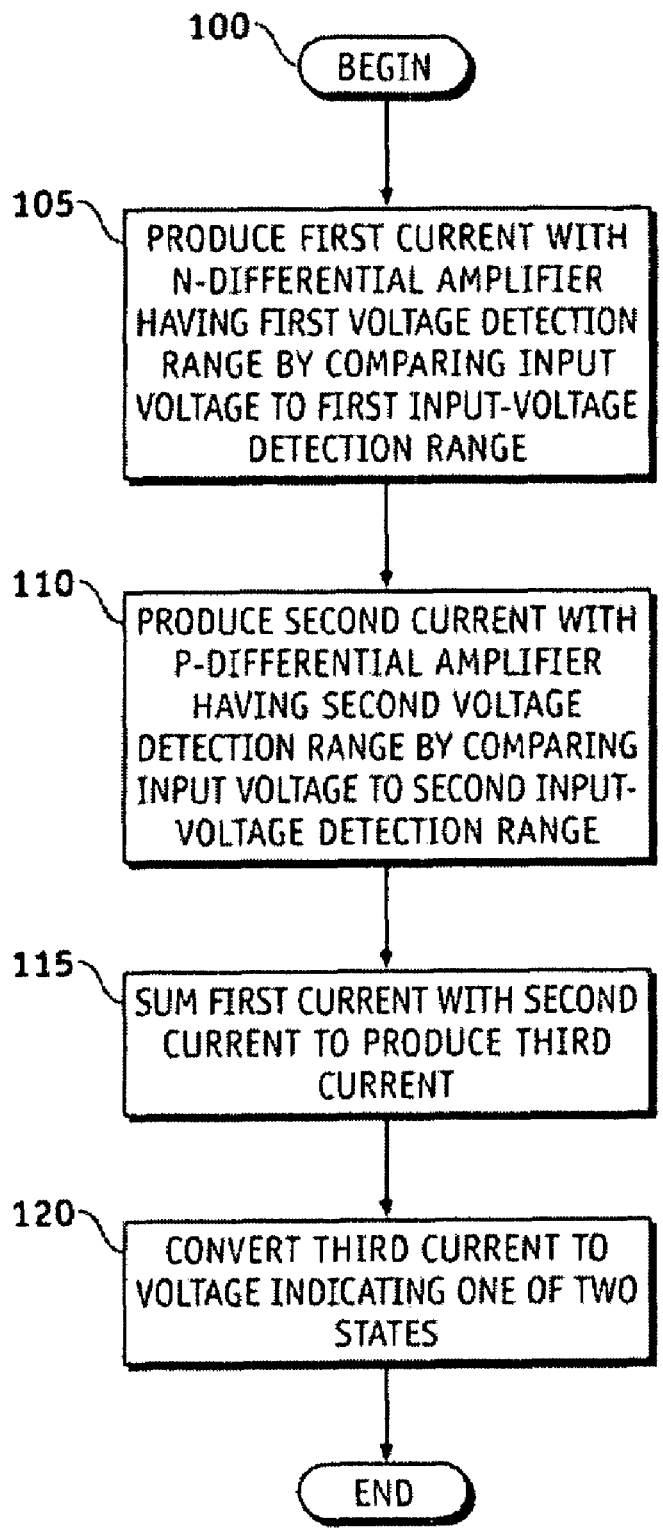
FIG. 4 is a flow diagram of a method for indicating one of two states in response to an input voltage in accordance with an exemplary embodiment of the present invention.

FIG. 4 is a flow diagram of a method for indicating one of two states in response to an input voltage in accordance with an exemplary embodiment of the present invention. The method begins at step 100. Referring to FIGS. 3 and 4, the N-type differential amplifier (M5, M6) produces a first current in response to the input voltage, such as the differential input signal (e.g., V+, V−), at step 105. The N-type differential amplifier (M5, M6) has a first effective input-voltage detection range. The P-type differential amplifier (M7, M8) produces a second current in response to the input voltage, such as the differential input signal (e.g., V+, V−), at step 110. The P-type differential amplifier (M7, M8) has a second effective input-voltage detection range that overlaps the first effective input-voltage detection range. The current mirror circuit (M1, M2, M3, M4) sums the first current with the second current to produce a third current at step 115. The third current flows through the resistive load $R_{L1}$, $R_{L2}$ to produce a first differential output voltage indicating one of the two states. Additionally, the second stage (Stage 2) may amplify the output differential voltage from the first stage (Stage 1) to produce a second differential output voltage based on the first differential output voltage, and the third stage (Stage 3) may further amplify the second differential output voltage to produce a single output voltage. The gain of the third stage (Stage 3) is greater than the gain of the second stage (Stage 2).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A rail-to-rail voltage comparator for indicating one of two states with an output signal in response to an input signal, the rail-to-rail voltage comparator comprising:

an input stage having an input configured to receive the input signal and having an output, said input stage comprising:

a first differential amplifier receiving the input signal and having a first input-voltage detection range, the first differential amplifier having first and second current inputs and configured to produce a first current in response to the input signal, wherein said first differential amplifier comprises an N-type differential amplifier;

a second differential amplifier receiving the input signal and having a second input-voltage detection range, the second differential amplifier configured to produce a second current in response to the input signal, said first input-voltage detection range overlapping said second input-voltage detection range, wherein said second differential amplifier comprises a P-type differential amplifier and has first and second outputs; and a current mirror circuit having a first input coupled to said first differential amplifier to receive said first current therefrom and having a second input coupled to said second differential amplifier to receive said second current therefrom, said current mirror circuit configured to produce a first voltage at said output of said input stage based on a sum of said first current and said second current, wherein said current mirror circuit comprises:

a first N-channel transistor having a gate coupled to said first output of said second differential amplifier, a drain terminal coupled to said gate of said first N-channel transistor and said first output of said second differential amplifier, and a source terminal coupled to a first reference potential;

a second N-channel transistor having a gate coupled to said second output of said second differential amplifier, a drain terminal coupled to said gate of said second N-channel transistor and said second output of said second differential amplifier, and a source terminal coupled to said first reference potential;

a third N-channel transistor having a gate coupled to said gate of said first N-channel transistor and said first output of said second differential amplifier, a drain terminal coupled to said second current input of said first differential amplifier, and a source terminal coupled to said first reference potential;

a fourth N-channel transistor having a gate coupled to said gate of said second N-channel transistor and said second output of said second differential amplifier, a drain terminal coupled to said first current input of said first differential amplifier, and a source terminal coupled to said first reference potential;

a first resistor having a first terminal coupled to said drain terminal of said fourth N-channel transistor and said first current input of said first differential amplifier and having a second terminal coupled to a second reference potential; and a second resistor having a first terminal coupled to said drain terminal of said third N-channel transistor and said second current input of said first differential amplifier and having a second terminal coupled to said second reference potential an amplification circuit having an input coupled to said output of said input stage and configured to incrementally amplify said first voltage to a second voltage and further configured to produce the output signal of the rail-to-rail voltage comparator having said second voltage, said second voltage indicating one of the two states; and a data latch coupled to said amplification circuit and configured to store the output signal of the rail-to-rail voltage comparator.

2. A rail-to-rail voltage comparator for indicating one of two states with an output signal in response to an input signal, the rail-to-rail voltage comparator comprising:

an input stage having an input configured to receive the input signal and having an output, said input stage comprising:

a first differential amplifier receiving the input signal and having a first input-voltage detection range, the first differential amplifier configured to produce a first current in response to the input signal;

a second differential amplifier receiving the input signal and having a second input-voltage detection range, the second differential amplifier configured to produce a second current in response to the input signal, said first input-voltage detection range overlapping said second input-voltage detection range; and a current mirror circuit having a first input coupled to said first differential amplifier to receive said first current therefrom and having a second input coupled to said second differential amplifier to receive said second current therefrom, said current mirror circuit configured to produce a first voltage at said output of said input stage based on a sum of said first current and said second current;

an amplification circuit having an input coupled to said output of said input stage and configured to incrementally amplify said first voltage to a second voltage and further configured to produce the output signal of the rail-to-rail voltage comparator having said second voltage said second voltage indicating one of the two states, wherein said amplification circuit comprises:

a first amplification stage coupled to said output of said input stage and having a first gain, said first stage configured to amplify said first voltage to an intermediate voltage based on said first gain; and a second amplification stage coupled to said first amplification stage and having a second gain, said second amplification stage configured to amplify said intermediate voltage to said second voltage based on said second gain, said second gain greater than said first gain; and a data latch coupled to said amplification circuit and configured to store the output signal of the rail-to-rail voltage comparator, wherein the data latch is coupled to said second stage for receiving the output signal having said second voltage.

3. A voltage comparator for converting a first signal to a second signal indicating one of two states, the voltage comparator comprising:

a first voltage detector having first and second differential voltage inputs configured to receive the first signal and having a current input, said first voltage detector configured to produce a first current at the current input thereof in response to the first signal;

a second voltage detector having first and second differential voltage inputs configured to receive the first signal and having a current output, said second voltage detector configured to produce a second current at the current output thereof in response to the first signal;

a current mirror circuit having a first input coupled to said current input of said first voltage detector, a second input coupled to said current output of said second voltage detector, and an output, said current mirror circuit configured to produce a first voltage at said output in response to a sum of said first current and said second current;

a first amplification stage coupled to said output of said current mirror circuit and configured to amplify said first voltage to an intermediate voltage;

a second amplification stage coupled to said first amplification stage and configured to amplify said intermediate voltage to a second voltage to produce the second signal having said second voltage; and a data latch coupled to said second stage and configured to store the second signal.

4. The voltage comparator in accordance with claim 3, wherein said first amplification stage has a first gain, and wherein said second amplification stage has a second gain, said second gain greater than said first gain.

5. The voltage comparator in accordance with claim 3, wherein said first voltage detector comprises an N-type differential amplifier, and wherein said second voltage detector comprises a P-type differential amplifier.

6. The voltage comparator in accordance with claim 3, wherein said current mirror circuit comprises a resistive load having a first terminal coupled to said current input of said first voltage detector and having a second terminal coupled to a reference potential.

7. The voltage comparator in accordance with claim 3, wherein the first signal has first and second differential voltages, and wherein said first voltage detector comprises:

a first transistor having a gate configured to receive said first differential voltage and having a source terminal;

a second transistor having a gate configured to receive said second differential voltage and having a source terminal coupled to said source terminal of said first transistor; and a third transistor having a gate configured to receive a first bias potential, a drain terminal coupled to said source terminal of said first transistor and said source terminal of said second transistor, and having a source terminal configured to receive a first reference potential, said third transistor configured to bias said first transistor and said second transistor.

8. The voltage comparator in accordance with claim 3, wherein the first signal has first and second differential voltages, and wherein said second voltage detector comprises:

a first transistor having a gate configured to receive said first differential voltage and having a source terminal;

a second transistor having a gate configured to receive said second differential voltage and having a source terminal coupled to said source terminal of said first transistor; and a third transistor having a gate configured to receive a second bias potential, a drain terminal coupled to said source terminal of said first transistor and said source terminal of said second transistor, and having a source terminal configured to receive a second reference potential, said third transistor configured to bias said first transistor and said second transistor.

9. The voltage comparator in accordance with claim 3, wherein said first voltage detector has first and second current inputs at said current input thereof, and wherein said second voltage detector has first and second current outputs at said current output thereof, and wherein said current mirror circuit comprises:

a first transistor having a gate coupled to said first current output of said second voltage detector, a drain terminal coupled to said gate of said first transistor and said first current output of said second voltage detector, and a source terminal coupled to a first reference potential;

a second transistor having a gate coupled to said second current output of said second voltage detector, a drain terminal coupled to said gate of said second transistor and said second current output of said second voltage detector, and a source terminal coupled to said first reference potential;

a third transistor having a gate coupled to said gate of said first transistor and said first current output of said second voltage detector, a drain terminal coupled to said second current input of said first voltage detector, and a source terminal coupled to said first reference potential;

a fourth transistor having a gate coupled to said gate of said second transistor and said second current output of said second voltage detector, a drain terminal coupled to said first current input of said first voltage detector, and a source terminal coupled to said first reference potential;

a first resistor having a first terminal coupled to said drain terminal of said fourth transistor and said first current input of said first voltage detector and having a second terminal coupled to a second reference potential; and a second resistor having a first terminal coupled to said drain terminal of said third transistor and said second current input of said first voltage detector and having a second terminal coupled to said second reference potential.

10. The voltage comparator in accordance with claim 3, wherein said current mirror circuit is configured to produce the first voltage in response to said sum of said first current and said second current, and wherein said first amplification stage comprises:

an N-type differential input amplifier configured to receive said first voltage; and an P-type differential output amplifier coupled to said N-type differential input amplifier and configured to produce first and second differential intermediate voltages based on said first voltage.

11. The voltage comparator in accordance with claim 3, wherein said current mirror circuit is configured to produce the first voltage based on said sum of said first current and said second current, and wherein said first amplification stage comprises:

a first transistor having a gate configured to receive said first voltage, a source terminal configured to receive a first reference potential, and a drain terminal;

a second transistor having a gate configured to receive said first voltage, a source terminal configured to receive said first reference potential, and a drain terminal;

a third transistor having a gate configured to receive a second bias potential, a drain terminal coupled to said drain terminal of said first transistor, and a source terminal;

a fourth transistor having a gate configured to receive said second bias potential, a drain terminal coupled to said drain terminal of said second transistor, and a source terminal coupled to said source terminal of said third transistor; and a bias transistor having a gate configured to receive said second bias potential, a source terminal configured to receive a second reference potential, and a drain terminal coupled to said source terminal of said third transistor and said source terminal of said fourth transistor.

12. The voltage comparator in accordance with claim 3, wherein said first amplification stage is configured to amplify said first voltage to first and second differential intermediate voltages, and wherein said second amplification stage comprises:
- an N-type differential input amplifier configured to receive said first and second differential intermediate voltages; and
- a single-ended output amplifier coupled to said N-type differential input amplifier and configured to produce said second voltage from said first and second differential intermediate voltages.

13. The voltage comparator in accordance with claim 3, wherein said first amplification stage is configured to amplify said first voltage to first and second differential intermediate voltages, and wherein said second stage comprises:
- a first transistor having a gate configured to receive said first differential intermediate voltage, a source terminal configured to receive a first reference potential, and a drain terminal;
- a second transistor having a gate configured to receive said second differential intermediate voltage, a source terminal configured to receive said first reference potential, and a drain terminal;
- a third transistor having a gate, a drain terminal coupled to said gate of said third transistor and said drain terminal of said first transistor, and a source terminal;
- a fourth transistor having a gate coupled to said gate of said third transistor, a drain terminal coupled to said drain terminal of said second transistor, and a source terminal coupled to said source of said third transistor; and
- a bias transistor having a gate configured to receive a second bias potential, a source terminal configured to receive a second reference potential, and a drain terminal coupled to said source terminal of said third transistor and said source terminal of said fourth transistor.

* * * * *